United States Patent
Ogata et al.

(10) Patent No.: US 9,571,937 B2
(45) Date of Patent: Feb. 14, 2017

(54) ACOUSTIC GENERATOR, AND ACOUSTIC GENERATION DEVICE AND ELECTRONIC APPARATUS HAVING THE SAME

(71) Applicant: KYOCERA Corporation, Kyoto-shi, Kyoto (JP)

(72) Inventors: Kazuhiro Ogata, Kirishima (JP); Keita Tsutsumiuchi, Kirishima (JP)

(73) Assignee: KYOCERA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 14/779,982

(22) PCT Filed: Dec. 25, 2014

(86) PCT No.: PCT/JP2014/084321
§ 371 (c)(1),
(2) Date: Sep. 25, 2015

(87) PCT Pub. No.: WO2015/145906
PCT Pub. Date: Oct. 1, 2015

(65) Prior Publication Data
US 2016/0050498 A1 Feb. 18, 2016

(30) Foreign Application Priority Data

Mar. 25, 2014 (JP) .................. 2014-061974
Aug. 25, 2014 (JP) .................. 2014-170593

(51) Int. Cl.
*H04R 25/00* (2006.01)
*H04R 17/10* (2006.01)
(Continued)

(52) U.S. Cl.
CPC .............. *H04R 17/10* (2013.01); *H04R 17/00* (2013.01); *H01L 41/083* (2013.01); *H01L 41/0973* (2013.01)

(58) Field of Classification Search
CPC ........ H04R 17/00; H01L 41/293; H01L 41/09; H01L 41/311; H01L 41/083
(Continued)

(56) References Cited

U.S. PATENT DOCUMENTS 4,352,961 A * 10/1982 Kumada ................ H04R 17/10
381/190
4,649,313 A * 3/1987 Ogawa ................ H01L 41/0926
310/328
(Continued)

FOREIGN PATENT DOCUMENTS

JP 2001-095094 A 4/2001

OTHER PUBLICATIONS

International Search Report in Japanese Language, PCT/JP2014/084321, Apr. 7, 2015, 7 pgs. (English Translation not yet available).

*Primary Examiner* — Brian Ensey
(74) *Attorney, Agent, or Firm* — Volpe and Koenig, P.C.

(57) ABSTRACT

An acoustic generator includes: a bimorph piezoelectric element including a stack of a plurality of internal electrodes and a plurality of piezoelectric layers, the bimorph piezoelectric element having a first main face and a second main face opposite the first main face; and a vibration plate joined to the second main face of the bimorph piezoelectric element. The bimorph piezoelectric element includes a region in a side of a first main face and a region in a side of a second main face, and, the plurality of piezoelectric layers constituting the region in the side of the first main face and the plurality of piezoelectric layers constituting the region in the side of the second main face are different from each other in at least one of relative permittivity and density.

8 Claims, 6 Drawing Sheets

(51) Int. Cl.
  *H04R 17/00* (2006.01)
  *H01L 41/083* (2006.01)
  *H01L 41/09* (2006.01)
(58) Field of Classification Search
  USPC .............................................. 381/173, 190
  See application file for complete search history.

(56) References Cited

U.S. PATENT DOCUMENTS

| | | |
|---|---|---|
| 6,741,710 B1 | 5/2004 | Takeshima et al. |
| 2004/0183407 A1 | 9/2004 | Takeshima et al. |

\* cited by examiner

ACOUSTIC GENERATOR, AND ACOUSTIC GENERATION DEVICE AND ELECTRONIC APPARATUS HAVING THE SAME

TECHNICAL FIELD

The present invention relates to an acoustic generator, and an acoustic generation device and an electronic apparatus that incorporate the acoustic generator.

BACKGROUND ART

There is known a piezoelectric element composed of a stack of a plurality of internal electrode layers and piezoelectric layers. The piezoelectric element is used as a source of vibration for an acoustic generator such as a panel speaker, and, it is known to use a bimorph piezoelectric element to produce an acoustic generator characterized by high sound pressure (refer to Patent Literature 1, for example).

CITATION LIST

Patent Literature

Patent Literature 1: Japanese Unexamined Patent Publication JP-A 2001-95094

SUMMARY OF INVENTION

Technical Problem

Even higher acoustic quality is currently sought after in an acoustic generator, as well as in an acoustic generation device and an electronic apparatus that incorporate the acoustic generator.

The invention has been devised in view of the circumstance as mentioned supra, and accordingly an object of the invention is to provide an acoustic generator capable of improvement in acoustic quality, and an acoustic generation device and an electronic apparatus that incorporate the acoustic generator.

Solution to Problem

The invention provides an acoustic generator comprising: a bimorph piezoelectric element composed of a stack of a plurality of internal electrodes and a plurality of piezoelectric layers, the bimorph piezoelectric element having a first main face and a second main face opposite the first main face; and a vibration plate joined to the second main face of the bimorph piezoelectric element, the bimorph piezoelectric element including a region in a side of a first main face and a region in a side of a second main face, the plurality of piezoelectric layers constituting the region in the side of the first main face and the plurality of piezoelectric layers constituting the region in the side of the second main face being different from each other in at least one of relative permittivity and density.

Moreover, the invention provides an acoustic generation device comprising: the acoustic generator mentioned above; and a housing which accommodates the acoustic generator.

Furthermore, the invention provides an electronic apparatus comprising: the acoustic generator mentioned above; an electronic circuit connected to the acoustic generator; and a casing which accommodates the electronic circuit and the acoustic generator, the electronic apparatus having a function of causing the acoustic generator to produce sound.

Advantageous Effects of Invention

According to the invention, in the acoustic generator, there is a difference between the region in the side of the first main face and the region in the side of the second main face in vibration characteristics, including amplitude, vibration mode, and resonance frequency. This makes it possible to attain evenness in sound pressure characteristics, and thereby afford high acoustic quality.

Moreover, according to the invention, the acoustic generation device incorporates the acoustic generator for producing high-quality sound, and is thus capable of production of high-quality sound.

Furthermore, according to the invention, the electronic apparatus incorporates the acoustic generator or the acoustic generation device for producing high-quality sound, and is thus capable of production of high-quality sound.

DESCRIPTION OF EMBODIMENTS

Hereinafter, embodiments of an acoustic generator, an acoustic generation device, and an electronic apparatus according to the invention will be described with reference to accompanying drawings. It is noted that the invention is not limited to the following embodiments.

Figure 1:
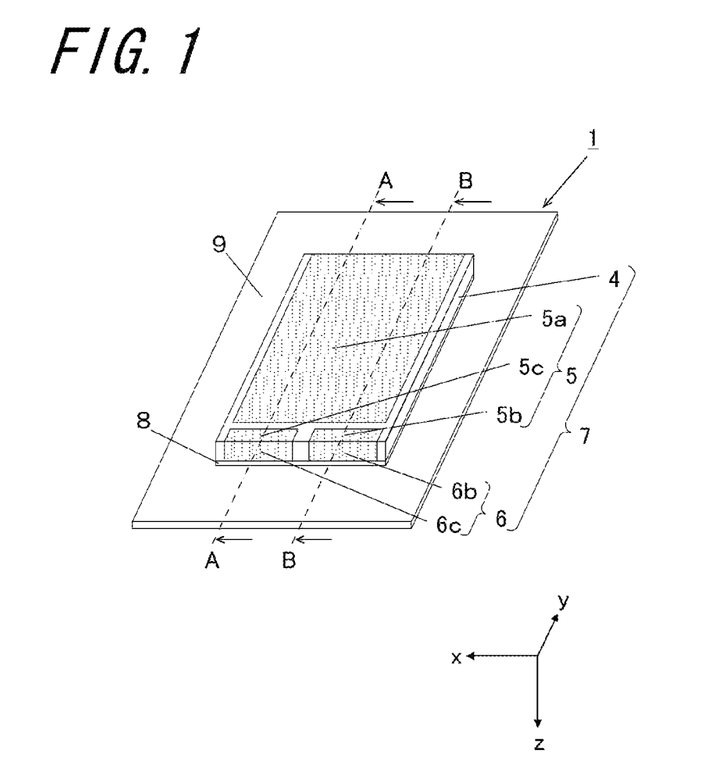
FIG. 1 is a schematic perspective view showing an embodiment of an acoustic generator according to the invention.
Figure 2:
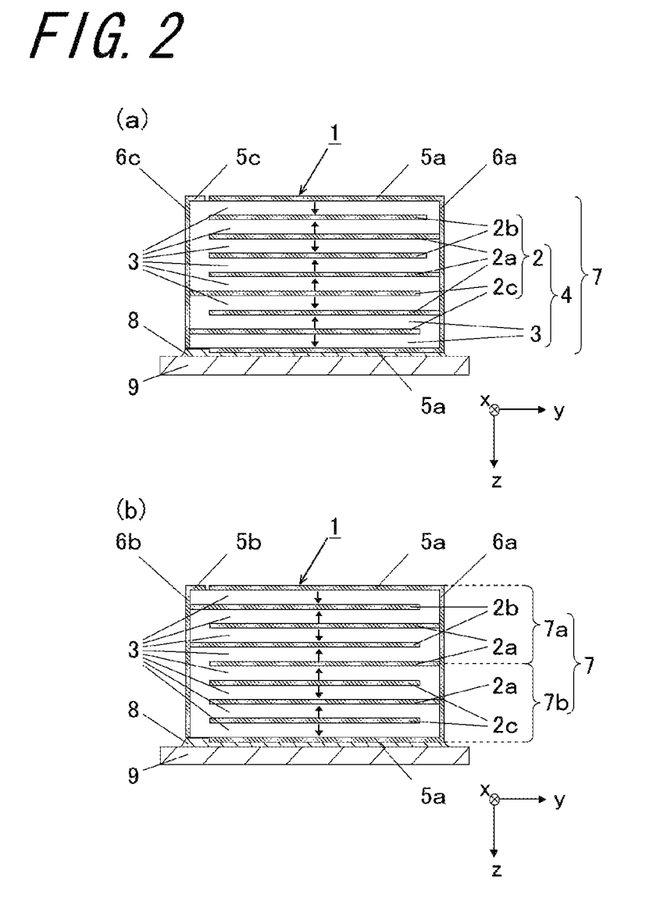
FIG. 2(a) is a sectional view taken along the line A-A shown in FIG. 1.
FIG. 2(b) is a sectional view taken along the line B-B shown in FIG. 1.

FIG. 1 is a schematic perspective view showing an embodiment of the acoustic generator. FIGS. 2(a) and 2(b) are a sectional view taken along the line A-A shown in FIG. 1 and a sectional view taken along the line B-B shown in FIG. 1, respectively, drawn to a larger scale than FIG. 1 in respect of a piezoelectric element, in particular, in the direction of thickness of the acoustic generator (Z direction as viewed in FIG. 1).

The acoustic generator 1 of the present embodiment shown in FIGS. 1, 2(a), and 2(b) comprises: a bimorph piezoelectric element 7 composed of a stack of internal electrodes 2 and piezoelectric layers 3, the bimorph piezoelectric element 7 having a first main face and a second main face opposite the first main face; and a vibration plate 9 joined to the second main face of the piezoelectric element 7.

The bimorph piezoelectric element 7 includes a region 7a in a side of a first main face and a region 7b in a side of a second main face, and, the region 7a in the side of the first main face and the region 7b in the side of the second main face are arranged so that their respective plurality of piezoelectric layers 3 as will hereafter be described are polarized in symmetric relation to each other, and are thus expanded and contracted oppositely in a direction parallel to the first and second main faces during driving operation. The boundary between the region 7a in the side of the first main face and the region 7b in the side of the second main face, while being generally located centrally of the piezoelectric element in a staked direction (thickness direction), can be identified on the basis of the electrode pattern of a plurality of internal electrodes 2 as will hereafter be described. The first main face refers to one end face of the piezoelectric element in the stacked direction, or equivalently the upper face thereof as viewed in FIG. 2, and the second main face refers to the other end face of the piezoelectric element in the stacked direction, or equivalently the lower face thereof as viewed in FIG. 2.

The bimorph piezoelectric element 7 comprises: a stacked body 4 composed of a stack of the plurality of internal electrodes 2 and the plurality of piezoelectric layers 3; a plurality of surface electrodes 5 disposed on a first main face of the stacked body 4; and a plurality of side electrodes 6 for providing electrical connection between the plurality of internal electrodes 2 and the plurality of surface electrodes 5.

The plurality of internal electrodes 2 constituting the stacked body 4 are laminated alternately with the plurality of piezoelectric layers 3 so that one piezoelectric layer 3 is sandwiched between the internal electrodes 2 in a vertical direction, and, a driving voltage is applied to the piezoelectric layer 3 held between them. More specifically, the plurality of internal electrodes 2 include: alternate first internal electrodes 2a; alternate second internal electrodes 2b arranged in the region 7a in the side of the first main face of the piezoelectric element 7 so as to be opposed to the first internal electrodes 2a; and alternate third internal electrodes 2c arranged in the region 7b in the side of the second main face of the piezoelectric element 7 so as to be opposed to the first internal electrodes 2a. For example, the first internal electrode 2a serves as a grounding electrode, and the second internal electrode 2b and the third internal electrode 2c serves as a positive electrode or a negative electrode. As constituent materials, for example, a conductor composed predominantly of silver or a silver-palladium alloy whose reactivity with piezoelectric ceramics constituting the piezoelectric layer 3 is low, or a conductor containing copper, platinum, or the like may be used, or alternatively a material obtained by adding a ceramic component or glass component to the aforementioned conductor may also be used.

The plurality of piezoelectric layers 3 constituting the stacked body 4 are formed of ceramics having piezoelectric properties, and, as such ceramics, for example, a perovskite oxide composed of lead zirconate titanate ($PbZrO_3$—$PbTiO_3$), lithium niobate ($LiNbO_3$), or lithium tantalate ($LiTaO_3$) may be used. It is preferable that the single-layer thickness of the piezoelectric layer 3 falls in the range of 0.01 to 0.1 mm, for example, to effect driving operation under low-voltage conditions. Moreover, it is preferable that the piezoelectric layer has a piezoelectric constant d31 of greater than or equal to 200 pm/V to attain appreciable flexural vibration.

Moreover, the plurality of surface electrodes 5 include: a first surface electrode 5a electrically connected to the first internal electrode 2a; a second surface electrode 5b electrically connected to the second internal electrode 2b; and a third surface electrode 5c electrically connected to the third internal electrode 2c. The plurality of surface electrodes 5 are disposed at least on the first main face of the stacked body 4. As exemplified in FIGS. 1 and 2, the first surface electrode 5a is disposed on each main face of the stacked body 4, and the second surface electrode 5b and the third surface electrode 5c are disposed only on the first main face of the stacked body 4. The placement of the first surface electrode 5a on both main faces allows the outermost piezoelectric layer 3 of the stacked body 4 to be held between the internal electrode 2 and the first surface electrode 5a, wherefore the outermost piezoelectric layer 3 is conducive to vibratory motion of the piezoelectric element 7 under application of driving voltage. While the second surface electrode 5b and the third surface electrode 5c may also be disposed on each main face of the stacked body 4, by placing the second surface electrode 5b and the third surface electrode 5c only on the first main face of the stacked body 4 as exemplified in FIGS. 1 and 2, it is possible to facilitate identification of a difference in relative permittivity as will hereafter described. Examples of materials that may be used to form the surface electrodes 5 include silver, a silver compound formed of silver containing glass predominantly composed of silica, and nickel.

Moreover, the plurality of side electrodes 6, which are disposed at least on one side face of the stacked body 4, include: a first side electrode 6a for providing electrical connection between the first internal electrode 2a and the first surface electrode 5a; a second side electrode 6b for providing electrical connection between the second internal electrode 2b and the second surface electrode 5b; and a third side electrode 6c for providing electrical connection between the third internal electrode 2c and the third surface electrode 5c. As exemplified in FIGS. 1 and 2, the first side electrode 6a is disposed on one of the opposed side faces of the stacked body, and the second side electrode 6b and the third side electrode 6c are disposed on the other side face opposite the one side face. The placement of the first side electrode 6a and the second, third side electrode 6b, 6c on different side faces ensures insulation between the first internal electrode 2a connected to the first side electrode 6a and the second, third internal electrode 2b, 2c connected to the second, third side electrode 6b, 6c. Alternatively, the three side electrodes 6 may be disposed on different side faces. As is the case with the surface electrode 5, examples of materials that may be used to form the side electrode 6 include silver, a silver compound formed of silver containing glass predominantly composed of silica, and nickel.

The electrical connection between the surface electrode 5 and the internal electrode 2 may be established by a through conductor passing through the piezoelectric layers 3 instead of the side electrode 6 as exemplified.

As described above, the first internal electrode 2a and the second internal electrode 2b are opposed to each other, with the piezoelectric layer 3 lying between them, in the region 7a in the side of the first main face, and, the first internal electrode 2a and the third internal electrode 2c are opposed to each other, with the piezoelectric layer 3 lying between them, in the region 7b in the side of the second main face. Moreover, the outermost piezoelectric layer 3 in the side of the first main face of the stacked body 4 is held between the second internal electrode 2b and the first surface electrode 5a connected to the first internal electrode 2a, and, the outermost piezoelectric layer 3 in the side of the second main face of the stacked body 4 is held between the third internal electrode 2c and the first surface electrode 5a connected to the first internal electrode 2a.

Moreover, the region 7a in the side of the first main face and the region 7b in the side of the second main face are different from each other in polarization of the piezoelectric layers 3. For example, as shown in FIGS. 2(a) and 2(b), in the region 7a in the side of the first main face, the piezoelectric layer 3 is polarized in a direction of an arrow shown therein, from the first internal electrode 2a toward the opposed second internal electrode 2b, and, the outermost piezoelectric layer 3 in the side of the first main face of the stacked body 4 is polarized in an arrow direction from the first surface electrode 5a connected toward the first internal electrode 2a to the second internal electrode 2b. On the other hand, in the region 7b in the side of the second main face, the piezoelectric layer 3 is polarized in an arrow direction from the third internal electrode 2c toward the opposed first internal electrode 2a, and, the outermost piezoelectric layer 3 in the side of the second main face of the stacked body 4 is polarized in an arrow direction from the third internal electrode 2c toward the first surface electrode 5a connected to the opposed first internal electrode 2a.

Thus, in the piezoelectric element 7, the region 7a in the side of the first main face (upper region) and the region 7b in the side of the second main face (lower region) are designed differently to attain symmetrical polarizing behavior, that is; the piezoelectric element 7 is of bimorph type. In the bimorph piezoelectric element 7, upon application of alternating electric field, the piezoelectric layer 3 in the region 7a in the side of the first main face and the piezoelectric layer 3 in the region 7b in the side of the second main face are expanded and contracted in opposite directions under the electric field, and, the piezoelectric layer 3 corresponding to the point of merger between the region 7a in the side of the first main face and the region 7b in the side of the second main face undergoes flexural vibration having an amplitude in the thickness direction due to vibration phase opposition between the region 7a in the side of the first main face and the region 7b in the side of the second main face. Polarization control on the piezoelectric layer 3 can be exercised by polarizing operation as will hereafter be described.

The form of the bimorph piezoelectric element 7 is not limited to particular shapes. In addition to a polygonal shape such as a rectangular shape as exemplified in FIG. 1, a circular shape, or an elliptical shape may also be adopted.

The vibration plate 9 is joined to the second main face of the thereby constructed piezoelectric element 7, thus producing the acoustic generator 1 of the present embodiment. Examples of materials that may be used as a joining material 8 for joining the vibration plate 9 to the piezoelectric element 7 include: a resin adhesive; a viscoelastic material in sheet form; and a material formed of a stack of a base material layer and a viscoelastic material-made layer. As these materials, acryl-based and epoxy-based adhesives, or rubber-based, acryl-based, silicone-based, and urethane-based sticking agents may be used. Moreover, as the base material layer, an acetate foam, an acrylic foam, a cellophane, a polyethylene foam, paper, and nonwoven fabric may be used.

Moreover, the vibration plate 9 is formed of an elastic material. Exemplary of such a materials are: a metal such as brass, phosphor bronze, and stainless steel; glass; a resin such as acrylic resin or polycarbonate resin; and a resin film such as a polyethylene film or a polyimide film. The form of the vibration plate 9 is not limited to particular shapes. In addition to the shape of a polygonal plate such as a rectangular plate as exemplified in FIG. 1, the shape of a circular plate, or the shape of an elliptical plate may also be adopted.

A plurality of piezoelectric elements 7 may be joined to the vibration plate 9. In this case, the piezoelectric elements 7 may be configured differently in respect of form, vibration characteristics, and so forth.

Although not shown in the drawings, as a wiring member for applying external alternating electric field to the piezoelectric element 7, for example, a lead wire formed of a tin-plated annealed copper wire or a flexible wiring board is suitable for use, and also, as a wiring joining material for establishing electrical and fixed connection between the wiring member and the piezoelectric element 7, for example, solder formed of an alloy of tin, copper, silver. etc. or an electrically-conductive joining material obtained by blending particles of conductive metal such as silver in resin is suitable for use.

According to the acoustic generator 1 of the present embodiment, in the bimorph piezoelectric element 7, the plurality of piezoelectric layers 3 constituting the region 7a in the side of the first main face and the plurality of piezoelectric layers 3 constituting the region 7b in the side of the second main face are different from each other in at least one of relative permittivity and density. In such a piezoelectric element 7, there is a difference in piezoelectric characteristics between the region 7a in the side of the first main face and the region 7b in the side of the second main face, thus causing a difference between the region 7a in the side of the first main face and the region 7b in the side of the second main face in vibration characteristics including amplitude, vibration mode, and resonance frequency. This leads to development of spurious vibration, namely harmonic or subharmonic vibration other than main vibration (flexural fundamental vibration or high-order vibration that is an integral multiple of the fundamental vibration) that is desirable for use as sound information, or vibration of different frequencies resulting from different vibration modes. The spurious vibration causes damping or division of natural vibration in the piezoelectric element 7. By virtue of this effect, in frequency-sound pressure characteristics, rapid changes in sound pressure at specific frequencies can be reduced with consequent evenness in sound pressure characteristics. This makes it possible to attain high acoustic quality.

The relative permittivity of the piezoelectric layers 3 of the region 7a in the side of the first main face and the region 7b in the side of the second main face can be obtained by calculation using the following method, for example.

The relative permittivity $\in 1$ of the piezoelectric layer of the region 7a in the side of the first main face is calculated on the basis of the following equation: $\in 1 = (C1 \cdot T1)/(S1 \cdot \in o)$, wherein C1 represents the capacitance of the region 7a in the side of the first main face; T1 represents the mean of the thicknesses of the piezoelectric layers 3 of the region 7a in the side of the first main face; S1 represents the area of a part of the piezoelectric layers 3 which is held between electrodes in the region 7a in the side of the first main face; and $\in o$ represents the permittivity of vacuum, which can be expressed in equation form as: $\in o = 8.854 \times 10^{-12}$ F/m.

The capacitance C1 of the region 7a in the side of the first main face is measured by applying one of two probe terminals connected to a capacitance measuring apparatus such as an impedance/gain-phase analyzer to the first surface electrode 5a, and the other to the second surface electrode 5b.

The area S1 of the part of the piezoelectric layers 3 which is held between electrodes in the region 7a in the side of the first main face can be calculated by, after cutting the piezoelectric element 7 lengthwise and widthwise, measuring the lengthwise dimension and the widthwise dimension of each of the range of the region 7a in the side of the first main face where the first internal electrode 2a and the second internal electrode 2b are overlapped in the direction of thickness of the piezoelectric element 7 and the range of that region where the second internal electrode 2b and the first surface electrode 5a are overlapped, by means of a measuring device such as a microscope. The mean T1 of the thicknesses of the piezoelectric layers 3 of the region 7a in the side of the first main face can be determined by measuring the thickness of each piezoelectric layer 3 of the region 7a in the side of the first main face also by means of a measuring device such as a microscope, and then performing calculation to derive the mean.

Likewise, the relative permittivity $\in 2$ of the piezoelectric layer 3 of the region 7b in the side of the second main face is calculated on the basis of the following equation: $\in 2 = (C2 \cdot T2)/(S2 \cdot \in o)$. The capacitance C2 of the region 7b in the side of the second main face is measured by applying one of the probe terminals to the first surface electrode 5a, and the other to the third surface electrode 5c. Moreover, the area S2 of a part of the piezoelectric layers 3 which is held between electrodes in the region 7b in the side of the second main face, as well as the mean T2 of the thicknesses of the piezoelectric layers 3 of the region 7b in the side of the second main face, can be measured by the same methods as those adopted in measuring S1 and T1.

Meanwhile, the density of each of the region 7a in the side of the first main face and the region 7b in the side of the second main face is measured by the following method, for example.

First, the bimorph piezoelectric element 7 is cut at the boundary between the region 7a in the side of the first main face and the region 7b in the side of the second main face by means of a dicing machine or otherwise. The boundary between the region 7a in the side of the first main face and the region 7b in the side of the second main face refers to a borderline about which their respective piezoelectric layers 3 are polarized symmetrically, as well as to the boundary of two regions that are expanded and contracted differently. In a case where, as exemplified, the region 7a in the side of the first main face and the region 7b in the side of the second main face have different internal electrode patterns, the conditions of polarization of the piezoelectric layers 3 can be predicted on the basis of the patterns, thus enabling determination of the boundary between the region 7a in the side of the first main face and the region 7b in the side of the second main face. When a layer which does not contribute to expansion and contraction lies between the region 7a in the side of the first main face and the region 7b in the side of the second main face, the piezoelectric element is cut at the boundary between the layer which does not contribute to expansion and contraction and each region.

After that, the density of the region 7a in the side of the first main face is measured in conformity with the Archimedes' method. More specifically, after a mass W1 of the region 7a in the side of the first main face is measured by an electronic balance, the region 7a in the side of the first main face is put in a container filled with water used as a medium solution to measure a mass W2 in the water. At the time of W2 measurement, a water temperature T is also measured to derive a water density ρw at the water temperature T with reference to a conversion table. On the basis of these measurement values, a density ρ1 of the region 7a in the side of the first main face is defined by the following equation: $\rho 1 = W1/(W1-W2) \times \rho w$.

The density of the region 7b in the side of the second main face can be measured by the same method.

In the case where the piezoelectric layers constituting the region 7a in the side of the first main face and the piezoelectric layers constituting the region 7b in the side of the second main face are different from each other in relative permittivity, it is preferable that the relative permittivity of the piezoelectric layers constituting the region 7b in the side of the second main face is lower than the relative permittivity of the piezoelectric layers constituting the region 7a in the side of the first main face. In this case, the region 7b in the side of the second main face which is smaller in the relative permittivity of the piezoelectric layer is joined to the vibration plate 9 under mechanical restraint, thus causing a greater difference in piezoelectric characteristics between the region 7a in the side of the first main face and the region 7b in the side of the second main face, wherefore spurious vibration is more likely to occur with consequent damping or division of natural vibration in the piezoelectric element 7. By virtue of this effect, in the acoustic generator 1 constructed by joining the piezoelectric element 7 to the vibration plate 9, in the frequency-sound pressure characteristics, rapid changes in sound pressure at specific frequencies can be further reduced with consequent evenness in sound pressure characteristics. This makes it possible to attain even higher acoustic quality. Moreover, since the extent of expansion and contraction at the second main face in an in-plane direction parallel to the main face is smaller than that at the first main face, it is possible to reduce the load on the joining material 8 for joining the vibration plate 9 to the piezoelectric element 7, and thereby attain enhanced durability.

Given that the relative permittivity of the piezoelectric layer 3 in the region 7b in the side of the second main face is defined as the reference, then the relative permittivity of the piezoelectric layer 3 in the region 7a in the side of the first main face advisably falls in a range of from 102% to 150%. When the ratio is less than 102%, the difference in piezoelectric characteristics between the region 7a in the side of the first main face and the region 7b in the side of the second main face is so small that the degree of damping or division of natural vibration in the piezoelectric element 7 tends to be lowered, thus causing the lowering of the effect of reducing rapid changes in sound pressure at specific frequencies in the frequency-sound pressure characteristics. On the other hand, when the ratio exceeds 150%, spurious vibration becomes so great that, in the frequency-sound pressure characteristics, there arises a rapid change in sound pressure at another frequency. This makes it difficult to attain the intended effect.

For example, when the region 7a in the side of the first main face and the region 7b in the side of the second main face are different from each other in the thickness of the piezoelectric layer 3, or in the areas of, respectively, the internal electrode 2 and the first surface electrode 5a, the resonance frequency of flexural fundamental vibration will vary due to geometrical effect, thus causing a change in the spurious vibration-frequency relationship with consequent difficulty in attaining the effect of bringing evenness of sound pressure. Furthermore, an increase of the resonance frequency of flexural fundamental vibration may cause a reduction in sound pressure at low frequencies ranging from 200 Hz to 1 kHz.

In this regard, the relative permittivity is equivalent to a dielectric constant which defines a piezoelectric constant of the piezoelectric layer, that is; when a relative permittivity is low, a piezoelectric constant is low, too, wherefore the resonance frequency of fundamental vibration in the piezoelectric element 7 will not vary even if the relative permittivity of the piezoelectric layer 3 is changed. This makes it possible to cause an appreciable difference in piezoelectric vibration characteristics between the region 7a in the side of the first main face and the region 7b in the side of the second main face, and thereby attain satisfactory acoustic quality with evenness in sound pressure characteristics, and also suppress a decrease in sound pressure.

Moreover, in the case where the relative permittivity of the piezoelectric layers 3 constituting the region 7b in the side of the second main face is lower than the relative permittivity of the piezoelectric layers 3 constituting the region 7a in the side of the first main face, it is also preferable that, within the region 7b in the side of the second main face, the piezoelectric layer 3 in the side of the second main face is lower in relative permittivity than the piezoelectric layer 3 in the side of the first main face. In other words, the piezoelectric layer located close to the second main face is preferably lower in relative permittivity than the piezoelectric layer located away from the second main face. For example, in the region 7b in the side of the second main face having the plurality of piezoelectric layers 3, it is preferable that the piezoelectric layers 3 are arranged in decreasing order of relative permittivity from one side of the region 7b away from the vibration plate 9 toward the other side thereof close to the vibration plate 9.

Also in the region 7b in the side of the second main face, the piezoelectric layer 3 in the side of the first main face and the piezoelectric layer 3 in the side of the second main face are different from each other in relative permittivity, that is; in the region 7b in the side of the second main face, the piezoelectric layers 3 of varying relative permittivity are arranged in the direction of thickness of the piezoelectric element 7. In this case, spurious vibration is more likely to occur with consequent damping or division of natural vibration in the piezoelectric element 7. Accordingly, in the acoustic generator 1 constructed by joining the piezoelectric element 7 to the vibration plate 9, in the frequency-sound pressure characteristics, rapid changes in sound pressure at specific frequencies can be further reduced, thus attaining evenness in sound pressure characteristics that will eventually afford even higher acoustic quality.

For example, the relative permittivity of each piezoelectric layer 3 can be measured on an individual basis in the following method. First, the piezoelectric element 7 is cut lengthwise and widthwise at its region where the internal electrode 2 and the first surface electrode 5a are entirely overlapped to obtain a sample having predetermined dimensions. Then, a needle probe pin is applied to the internal electrodes 2, which hold a piezoelectric layer 3 to be subjected to measurement in between, left exposed at the periphery of the sample cut from the piezoelectric element to measure a capacitance C3 of the piezoelectric layer 3. Moreover, the length and width of the internal electrode 2 is measured by means of a measuring device such as a microscope to calculate an area S3 of the internal electrodes 2 that hold the piezoelectric layer 3 under measurement in between. Then, a thickness T3 of the piezoelectric layer 3 which has undergone capacitance measurement is measured in a similar way. On the basis of these measurement values, in a manner such as described previously, the relative permittivity of the target piezoelectric layer 3 can be determined by using the following equation: $\in 3=(C3 \cdot T3)/(S3 \cdot \in o)$. This method also allows determination as to whether the piezoelectric layers are so arranged that the relative permittivity becomes smaller gradually from the piezoelectric layer away from the vibration plate 9 toward the piezoelectric layer close to the vibration plate 9.

In the case where the piezoelectric layers constituting the region 7a in the side of the first main face and the piezoelectric layers constituting the region 7b in the side of the second main face are different from each other in density, it is preferable that the density of the region 7b in the side of the second main face is lower than the density of the region 7a in the side of the first main face. In this case, the region 7b in the side of the second main face with lower density is mechanically restrained by the vibration plate 9, thus causing a greater difference in piezoelectric vibration characteristics between the region 7a in the side of the first main face and the region 7b in the side of the second main face, wherefore spurious vibration is more likely to occur with consequent damping or division of natural vibration in the piezoelectric element 7. By virtue of this effect, in the acoustic generator 1 constructed by joining the piezoelectric element 7 to the vibration plate 9, in the frequency-sound pressure characteristics, rapid changes in sound pressure at specific frequencies can be further reduced with consequent evenness in sound pressure characteristics. This makes it possible to attain even higher acoustic quality.

For example, given that the density of the region 7b in the side of the second main face is defined as the reference (100%), then the density of the region 7a in the side of the first main face advisably falls in a range of from 100.3% to 102.5%. When the ratio is less than 100.3%, the difference in piezoelectric vibration characteristics between the region 7a in the side of the first main face and the other main face-side region 7b is so small that the degree of damping or division of natural vibration in the piezoelectric element 7 tends to be lowered, thus causing the lowering of the effect of reducing rapid changes in sound pressure at specific frequencies in the frequency-sound pressure characteristics. On the other hand, when the ratio exceeds 102.5%, spurious vibration becomes so great that, in the frequency-sound pressure characteristics, there arises a rapid change in sound pressure at another frequency. This makes it difficult to attain the intended effect.

In the case where the density of the plurality of piezoelectric layers 3 of the region 7b in the side of the second main face is lower than the density of the plurality of piezoelectric layers 3 of the region 7a in the side of the first main face, it is also preferable that, within the region 7b in the side of the second main face, the piezoelectric layer 3 in the side of the second main face is lower in density than the piezoelectric layer 3 in the side of the first main face. In other words, the piezoelectric layer close to the second main face is preferably lower in density than the piezoelectric layer away from the second main face. Moreover, it is preferable that the piezoelectric layers are so arranged that the density becomes smaller gradually from the piezoelectric layer away from the vibration plate 9 toward the piezoelectric layer close to the vibration plate 9. Also in the region 7b in the side of the second main face, the piezoelectric layer in the side of the first main face and the piezoelectric layer in the side of the second main face are different from each other in density, that is; in the region 7b in the side of the second main face, the piezoelectric layers of varying density are arranged in the direction of thickness of the piezoelectric element 7. In this case, spurious vibration is more likely to occur with consequent damping or division of natural vibration in the piezoelectric element 7. Accordingly, in the acoustic generator 1 constructed by joining the piezoelectric element 7 to the vibration plate 9, in the frequency-sound pressure characteristics, rapid changes in sound pressure at specific frequencies can be further reduced, thus attaining evenness in sound pressure characteristics that will eventually afford even higher acoustic quality.

The densities of the individual piezoelectric layers 3 can be measured separately by performing the aforestated density measurement on each and every piezoelectric layer 3. This method also allows determination as to whether the piezoelectric layers 3 are so arranged that the density becomes smaller gradually from the piezoelectric layer 3 away from the vibration plate 9 toward the piezoelectric layer 3 close to the vibration plate 9.

Moreover, the piezoelectric layers 3 constituting the region 7a in the side of the first main face and the piezoelectric layers 3 constituting the region 7b in the side of the second main face may be configured differently not only in density but also in relative permittivity.

Figure 3:
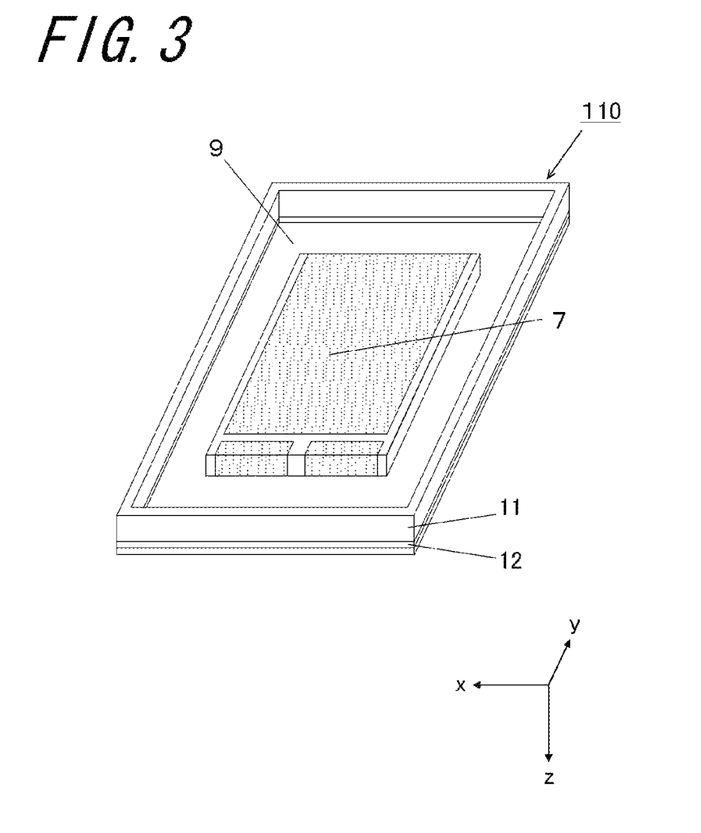
FIG. 3 is a schematic perspective view showing another embodiment of the acoustic generator according to the invention.

Moreover, the acoustic generator of the present embodiment may be provided with a frame body 11 which is disposed along the outer periphery of the vibration plate 9. In this case, for example, as shown in FIG. 3, an acoustic generator 110 can be obtained by joining the frame body 11 to the outer periphery of the piezoelectric element 7-bearing main face of the vibration plate 9. The placement of the frame body 11 helps support the vibration plate 9, thus facilitating fixed installation to, for example, a casing of an electronic apparatus. Furthermore, in the thus constructed acoustic generator 110, the creation of a vibration space enables an increase in the vibration amplitude of the vibration plate 9. This makes it possible to reduce rapid changes in sound pressure at specific frequencies in the frequency-sound pressure characteristics, and thereby attain satisfactory acoustic quality while achieving improvement in sound pressure.

Materials having great rigidity and high elasticity, including a metal such as stainless steel, glass, acrylic resin, polycarbonate resin, or polybutylene terephthalate resin, are suitable for use in forming the frame body 11.

The frame body 11 is joined to the main face of the vibration plate 9 via a joining material 12. Examples of materials that may be used as the joining material 12 include: a resin adhesive; a viscoelastic material in sheet form; and a material formed of a stack of a base material layer and a viscoelastic material-made layer. As these materials, acryl-based and epoxy-based adhesives, or rubber-based, acryl-based, silicone-based, and urethane-based sticking agents may be used. Moreover, as the base material layer, an acetate foam, an acrylic foam, a cellophane, a polyethylene foam, paper, and nonwoven fabric may be used.

As exemplified in FIG. 3, by joining the frame body 11 to the main face of the vibration plate 9 bonded with the piezoelectric element 7, especially when the thickness of a combination of the frame body 11 and the joining material 12 is greater than the thickness of the piezoelectric element 7, the piezoelectric element 7 can be protected by the frame body 11. Moreover, in this case, a resin layer may be provided so as to cover the main face of the vibration plate 9 located inside the frame body 11, or cover both the main face of the vibration plate 9 located inside the frame body 11 and the piezoelectric element 7. The resin layer undergoes vibratory motion together with the piezoelectric element 7 and the vibration plate 9, wherefore damping effect can be produced from the resin layer. This makes it possible to achieve further improvement in acoustic quality, as well as to increase the effect of protecting the piezoelectric element 7.

For example, the resin layer is formed of acrylic resin, and is preferably designed so that a Young's modulus thereof falls in a range of 1 MPa to 1 GPa. Although the resin layer does not necessarily have to be extended to an extent that would cover the surface of the piezoelectric element 7, by forming the resin layer so as to also cover the surface of the piezoelectric element 7 for embedding of the piezoelectric element 7 in the resin layer, it is possible to induce an adequate damping effect, and thereby suppress occurrence of a resonance phenomenon, thus minimizing peaks and dips in sound-pressure frequency characteristics.

The frame body 11 may be provided on both main faces of the vibration plate 9. Moreover, a lid composed of a plate member may be disposed on an opened face of the frame body 11, that is, a face of the frame body 11 which is not joined to the vibration plate 9.

To use the acoustic generator 1, 110 constructed by joining the bimorph piezoelectric element 7 to the main face of the vibration plate 9 as a source of sound production for an electronic apparatus, for example, the acoustic generator is installed so that the other main face of the vibration plate 9 is secured to a casing or the like of the electronic apparatus via a joining material, or that the vibration plate 9 is mechanically secured, or secured via a joining material, to a support section provided in a casing or the like of the electronic apparatus, or alternatively, the acoustic generator is mounted in an acoustic generation device equipped with a small casing incorporated in the casing of the electronic apparatus.

The following describes a method of manufacturing the acoustic generator 1, 110 of the present embodiment.

First, a ceramic green sheet which constitutes the piezoelectric layer 3 is formed. Specifically, a ceramic slurry is prepared by mixing calcined powder of piezoelectric ceramics, a binder made of an organic high polymer such as acrylic polymer or butyral polymer, and a plasticizer. Then, a ceramic green sheet is formed using the ceramic slurry by a tape molding technique such as the doctor blade method or the calender roll method. Piezoelectric ceramics having piezoelectric properties may be used, and exemplary of the piezoelectric ceramics is a perovskite oxide formed of lead zirconate titanate ($PbZrO_3$—$PbTiO_3$). Moreover, as the plasticizer, for example, dibutyl phthalate (DBP) and dioctyl phthalate (DOP) may be used.

Next, an electrically-conductive paste which constitutes the internal electrode 2 is applied, in an internal-electrode 2 pattern, onto the ceramic green sheet by a printing technique such as screen printing method. The conductive paste is prepared by admixing a binder and a plasticizer in powder of a silver-palladium metal. A plurality of the ceramic green sheets with the printed conductive paste are laminated on top of each other to form a ceramic green sheet layered body. The ceramic green sheet laminate is heated at a predetermined temperature for binder removal treatment, and is then fired at a temperature of 900° C. to 1200° C. in a firing bowl composed predominantly of aluminum oxide, zirconium oxide, or magnesium oxide. Thus, a stacked body 4 in sintered compact form comprising a stack of a plurality of the piezoelectric layers 3 and a plurality of internal electrodes 2 is produced. The stacked body 4 may be ground or otherwise into a predetermined configuration by using a surface grinder, for example.

The surface electrode 5 and the side electrode 6 are formed by printing an electrically-conductive paste which constitutes the surface electrode 5 and the side electrode 6 to the main and side faces of the stacked body 4 in surface-electrode 5 and side-electrode 6 patterns by a printing technique such as screen printing method, and thereafter drying the paste, and performing baking at a temperature of 650 to 750° C. The conductive paste constituting the surface electrode 5 and the side electrode 6 is silver glass-containing conductive paste prepared by adding a binder, a plasticizer, and a solvent to a mixture of glass and conductive particles composed predominantly of silver.

The electrical connection between the surface electrode 5 and the internal electrode 2 may be established by a through conductor passing through the piezoelectric layers 3 instead of the side electrode 6. In this case, for example, a through hole is created in the ceramic green sheet by boring process such as punching using a punch die or lasering, before printing the conductive paste constituting the surface electrode 5 and the side electrode 6, and then a through conductor-forming conductive paste is filled in the through hole by a printing technique. The through conductor-forming conductive paste can be obtained by making viscosity adjustment to a conductive paste similar to that constituting the surface electrode 5 and the side electrode 6 by changing the amounts of the binder or the solvent.

The piezoelectric element 7 is subjected to polarization process to impart piezoelectric activity, whereby the piezoelectric element 7 serves as a vibration generator which is flexurally vibrated upon application of voltage. In the polarization process using a direct current power supply, for example, the first surface electrode 5a is connected to the grounding electrode, the second surface electrode 5b is connected to the positive electrode, and the third surface electrode 5c is connected to the negative electrode. Then, for example, a potential difference of 2 kV/mm to 3 kV/mm is applied at an ambient temperature of 15° C. to 35° C. for a few seconds as application time. The voltage, the ambient temperature, and the application time are determined appropriately in accordance with the properties of the piezoelectric material.

To configure the region 7a in the side of the first main face and the region 7b in the side of the second main face differently in respect of at least one of the relative permittivity and the density of the piezoelectric layers 3, raw materials that are different from each other in at least one of relative permittivity and density are prepared for forming the piezoelectric layers, and, ceramic green sheets are formed using each raw material. Then, a stack of sheets that constitute the region 7a in the side of the first main face and a stack of sheets that constitute the region 7b in the side of the second main face are laminated together.

As an alternative to the above method, the following process can be adopted. While a firing setter composed predominantly of, for example, aluminum oxide, zirconium oxide, or magnesium oxide is used in the aforestated firing process, for example, by adjusting the content of lead in the firing setter, it is possible to control the lead compositional ratio in the piezoelectric layers 3 of the fired stacked body 4 for adjustment of the relative permittivity and the density of each of the region 7a in the side of the first main face and the region 7b in the side of the second main face in the piezoelectric element 7.

Specifically, the earlier described calcined powder of piezoelectric ceramics is applied to the firing setter, and the setter is calcined at a temperature of 900° C. to 1300° C. In a case where the piezoelectric layer 3 is thin or the number of layers constituting the stacked body 4 is small, the calcining process is performed at a somewhat higher temperature than the above temperatures, and the amount of lead contained in the firing setter is slightly increased. On the other hand, in a case where the piezoelectric layer 3 is thick or the number of layers constituting the stacked body 4 is large, the calcining process is performed at a somewhat lower temperature, and the amount of lead contained in the firing setter is slightly decreased. This makes it possible to control the lead compositional ratio in the piezoelectric layers 3 so that the lead composition on the substantially feedstock composition-to-feedstock composition basis decreases gradually from the piezoelectric layer away from the firing setter toward the piezoelectric layer close to the firing setter, and thereby cause the relative permittivity and the density to become smaller gradually from the piezoelectric layer away from the firing setter toward the piezoelectric layer close to the firing setter. Thus, the relative permittivity and the density of the region 7a in the side of the first main face and those of the region 7b in the side of the second main face in the piezoelectric element 7 can be set at desired values. Moreover, the relative permittivity and the density of the piezoelectric layer 3 of the region 7b in the side of the second main face can be adjusted to be lower than the relative permittivity and the density of the piezoelectric layer 3 of the region 7a in the side of the first main face, and also, within the region 7b in the side of the second main face, the relative permittivity and the density can be adjusted to decrease gradually from the piezoelectric layer 3 away from the vibration plate 9 toward the piezoelectric layer 3 close to the vibration plate 9.

Moreover, it is advisable to specify the number of times the firing setter is used and the number of times the calcining process is performed. For example, the firing setter is subjected to heat treatment in the atmosphere at a temperature of 1000° C. to 1300° C. without using the firing bowl at each firing process, and, following the release of the lead content, the calcining process is performed in accordance with the aforestated method. This makes it possible to control the content of lead in the firing setter constant, and thereby attain the desired relative permittivity and density with stability.

According to this manufacturing method, the relative permittivity and the density of each of the region 7a in the side of the first main face and the region 7b in the side of the second main face in the piezoelectric element 7 can be set at desired values while rendering the region 7a in the side of the first main face and the region 7b in the side of the second main face of the bimorph piezoelectric element 7 substantially equal in the area of the internal electrode 2, the thickness of the piezoelectric layer 3, and the number of the internal electrodes 2 and the piezoelectric layers 3 to be laminated. Moreover, the relative permittivity and the density of the piezoelectric layer 3 of the region 7b in the side of the second main face can be adjusted to be lower than the relative permittivity and the density of the piezoelectric layer 3 of the region 7a in the side of the first main face, and also, within the region 7b in the side of the second main face, the relative permittivity and the density can be adjusted to decrease gradually from the piezoelectric layer 3 away from the vibration plate 9 toward the piezoelectric layer 3 close to the vibration plate 9. Accordingly, there is no need to prepare a plurality of green sheets of varying thickness, and a plurality of print plates of different types required to change the area of the internal electrode 2, wherefore easy-to-handle green sheets having an adequate thickness may be used, thus improving productivity.

The acoustic generator 1 is constructed by fixedly joining the vibration plate 9 to the second main face of the piezoelectric element 7 via the joining material 8. In a case where, for example, an anaerobic resin adhesive is used for the joining material 8, a coating of an anaerobic adhesive-forming paste is formed at a predetermined location of the vibration plate 9 by means of screen printing or otherwise. After that, the anaerobic adhesive-forming paste abutting on the piezoelectric element 7 is cured under pressure, thus fixedly joining the piezoelectric element 7 to the vibration plate 9. The anaerobic adhesive-forming paste coating may be formed on the piezoelectric element 7. As another example, a thermosetting adhesive such as an epoxy adhesive may be used for the joining material 8.

Moreover, the wiring member for voltage application is connected to the piezoelectric element 7. For example, a flexible wiring board may be used as the wiring member. The wiring member is fixedly connected (joined) to the piezoelectric element 7 by an electrically-conductive adhesive, for example. To begin with, a coating of a conductive adhesive-forming paste is formed at a predetermined location of the piezoelectric element 7 by means of screen printing or otherwise. After that, the conductive adhesive-forming paste abutting on the flexible wiring board is cured, thus fixedly joining the flexible wiring board to the piezoelectric element 7. The conductive adhesive-forming paste coating may be formed on the flexible wiring board. The connection of the wiring member with the piezoelectric element 7 may be effected either before or after the joining together of the piezoelectric element 7 and the vibration plate 9.

In the case of joining the frame body 11 to the outer periphery of the main face of the vibration plate 9, the frame body 11, which is formed in a desired shape using, for example, a metal such as stainless steel, glass, acrylic resin, polycarbonate resin, or polybutylene terephthalate, is bonded to the vibration plate via the joining material 12. Moreover, in the case of providing the resin layer so as to cover the bimorph piezoelectric element 7, a resin is applied after the frame body 11 is joined.

The acoustic generator 1, 110 can be obtained by the manufacturing method thus far described.

The following describes an embodiment of an acoustic generation device according to the invention.

Figure 4:
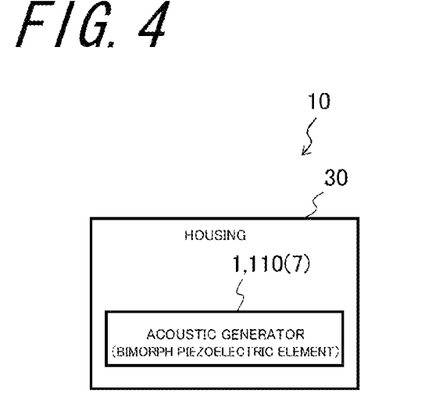
FIG. 4 is a block diagram showing an embodiment of an acoustic generation device according to the invention.

As shown in FIG. 4, an acoustic generation device 10, which is a sounding apparatus like a speaker, comprises the acoustic generator 1, 110 and a housing 30 which accommodates the acoustic generator 1, 110. Part of the housing 30 may be designed so as to serve as a vibration plate constituting the acoustic generator 1. The expression "the housing 30 accommodates the acoustic generator 1, 110" may be also taken to mean that part of the acoustic generator 1, 110 (piezoelectric element 7) is stored in the housing 30".

The housing 30 produces resonance of sound generated by the acoustic generator 1, 110 in the inside thereof, and allows the sound to radiate out from a non-illustrated opening formed in the housing 30. The housing 30 can be formed of various materials, including a metal such as aluminum and a magnesium alloy, a resin such as polycarbonate, and wood. The placement of such a housing 30 makes it possible to increase sound pressure in a low-frequency range, for example. The frame body 11 and the above-described plate member (lid) combined in one piece may be used as the housing 30. The creation of a resonance space by using the housing 30 enables improvement in sound pressure.

According to the invention, there is provided the acoustic generation device 10 with high acoustic quality and high sound pressure.

Figure 5:
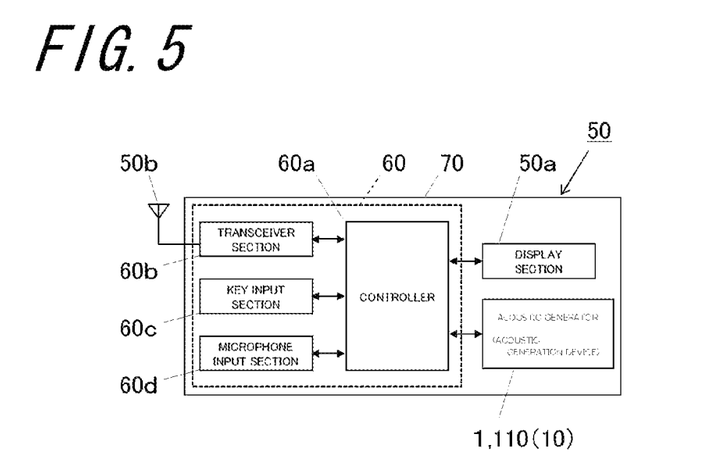
FIG. 5 is a block diagram showing an embodiment of an electronic apparatus according to the invention.

Next, an example of an electronic apparatus incorporating the acoustic generator 1, 110 (or the acoustic generation device 10) will be described with reference to FIG. 5. FIG. 5 is a diagram showing the structure of the electronic apparatus 50 in accordance with an embodiment of the invention. In FIG. 5, there is shown a case where the electronic apparatus 50 is a portable terminal. In the drawing, only the constituent components considered necessary for explanation of the device are illustrated, and other conventional constituent components are omitted.

As shown in FIG. 5, the electronic apparatus 50 of the present embodiment comprises: the acoustic generator 1, 110 (or the acoustic generation device 10); an electronic circuit 60 connected to the acoustic generator 1, 110 (or the acoustic generation device 10); and a casing 70 which accommodates the electronic circuit 60 and the acoustic generator 1, 110 (or the acoustic generation device 10). The electronic apparatus 50 has the function of causing the acoustic generator 1, 110 (or the acoustic generation device 10) to produce sound. In the electronic apparatus 50 of the invention, it is possible not only to place the acoustic generator 1, 110 directly in the casing 70, but to place the acoustic generation device 10 accommodating the acoustic generator 1 (a combination of the acoustic generator 1 and the housing) in the casing 70. Moreover, the casing 70 may be so designed that part thereof serves as a vibration plate constituting the acoustic generator 1, 110.

The electronic apparatus 50 includes the electronic circuit 60. For example, a circuit for processing image information shown on a display and sound information transmitted by a portable terminal, or a communication circuit exemplifies the electronic circuit 60. The electronic circuit 60 may be constructed of either at least one of such circuits or all of them. Another circuit having different capability may also be adopted. Moreover, a plurality of electronic circuits may be provided. The electronic circuit and the piezoelectric element 7 are connected to each other by non-illustrated wiring for connection.

The electronic circuit 60 shown in the drawing is composed of, for example, a controller 60a, a transceiver section 60b, a key input section 60c, and a microphone input section 60d. The electronic circuit 60 is connected to the acoustic generator 1, 110, and has the function of outputting a sound signal to the acoustic generator 1, 110. The acoustic generator 1, 110 produces sound in response to the sound signal inputted from the electronic circuit 60 to the acoustic generator.

Moreover, the electronic apparatus 50 includes a display section 50a, an antenna 50b, and the acoustic generator 1, 110. Also provided in the electronic apparatus 50 is the casing 70 for accommodating these devices. In FIG. 5, there is shown a case where the individual devices, including the controller 60a, are each stored in a single casing 70, but this does suggest any limitation to the way to store each device. In the present embodiment, it is sufficient that at least the electronic circuit 60 and the acoustic generator 1, 110 are stored in a single casing 70.

The controller 60a serves as a control section of the electronic apparatus 50. The transceiver section 60b effects, for example, transmission and reception of data via the antenna 50b under the control of the controller 60a. The key input section 60c, which serves as an input device of the electronic apparatus 50, accepts key input operation performed by an operator. The key input section 60c may be designed as either a key in button form or a touch panel formed integrally with the display section 50. The microphone input section 60d, which also serves as an input device of the electronic apparatus 50, accepts, for example, sound input operation performed by an operator. The display section 50a, which serves as a display output device of the electronic apparatus 50, produces output of information to be displayed under the control of the controller 60a. The display section 50a corresponds to a display 14 as will hereafter be described with reference to FIGS. 6 to 8. The display is a display device having the function of showing image information, and, a heretofore known display such for example as a liquid crystal display or an organic EL display is suitable for use as the display.

The acoustic generator 1, 110 (or the acoustic generation device 10) operates as a sound output device in the electronic apparatus 50. The acoustic generator 1, 110 (or the acoustic generation device 10) is connected to the controller 60a of the electronic circuit 60, and produces sound upon application of a voltage controlled by the controller 60a.

Figure 6:
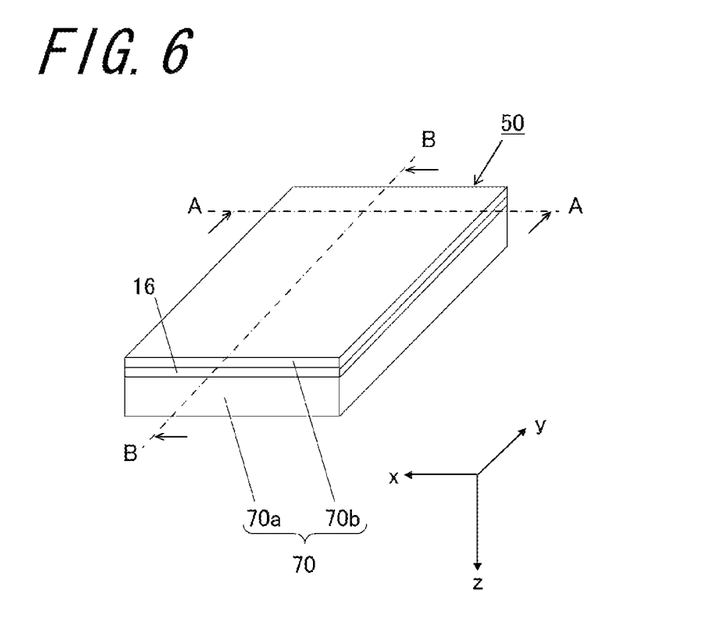
FIG. 6 is a schematic perspective view showing the embodiment of the electronic apparatus according to the invention.
Figure 7:
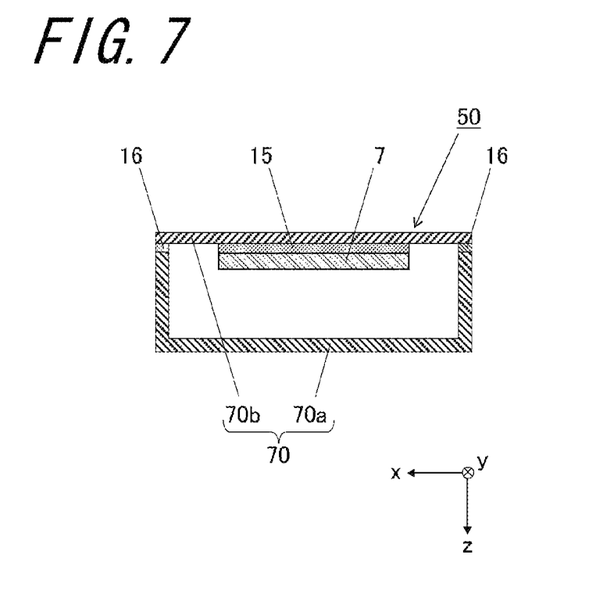
FIG. 7 is a sectional view taken along the line A-A shown in FIG. 6.
Figure 8:
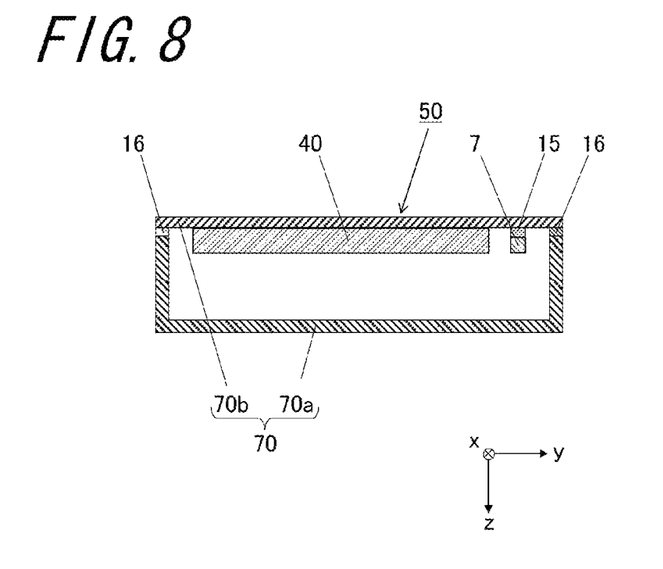
FIG. 8 is a sectional view taken along the line B-B shown in FIG. 6.

Moreover, the electronic apparatus 50 in the form of a portable terminal will be described with reference to FIGS. 6 to 8. The electronic apparatus 50 comprises the bimorph piezoelectric element 7, the electronic circuit (not shown in the drawings), the casing 70, and the display 14. In this embodiment, the casing 70 is composed of a casing main body 70a and a cover 70b. The other main face of the piezoelectric element 7 is joined to the casing 70 via a device joining material 15, thus constructing the acoustic generator of the invention in which the cover 70b that is part of the casing 70 serves as the vibration plate 9. FIG. 6 is a schematic perspective view schematically showing the electronic apparatus of the invention, FIG. 7 is a schematic sectional view taken along the line A-A shown in FIG. 6, and FIG. 8 is a schematic sectional view taken along the line B-B shown in FIG. 6.

It is preferable that the piezoelectric element 7 and the casing 70 are joined together via a deformable joining material. That is, in FIGS. 7 and 8, the device joining material 15 is the deformable joining material. In the case where the piezoelectric element 7 and the casing 70 are joined together via the deformable device joining material 15, upon transmission of vibration from the piezoelectric element 7, the deformable device joining material 15 becomes deformed more greatly than does the casing 70. At this time, vibration in reverse phase reflected from the casing 70 can be mitigated by the deformable device joining material 15, wherefore the piezoelectric element 7 is capable of transmitting strong vibration to the casing 70 without incurring the influence of ambient vibration.

It is particularly preferable that the device joining material 15 is, at least partly, formed of a viscoelastic material. This is because, while strong vibration from the piezoelectric element 7 can be transmitted to the casing 70, weak vibration reflected from the casing 70 can be absorbed by the device joining material 15. For example, a double-faced tape formed by applying a sticking agent to both sides of a base material composed of a nonwoven fabric or the like, or a joining member including an adhesive having elasticity may be used. The material in use preferably has a thickness of 10 µm to 2000 µm, for example.

In this case, the piezoelectric element 7 is attached to part of the casing 70 constituting the cover 70b for the display 14, and this part of the casing 70, that is, the cover 70b functions as the vibration plate 9. The cover 70b (vibration plate 9) for the display 14 may be designed to have an input device such as a touch panel. Moreover, part of the casing 70, while constituting the cover for the display so that the display can be placed inside the cover in this case, may be designed as a display, and, the display may have an input device such as a touch panel. In another alternative, the piezoelectric element 7 may be joined to a display via the device joining material 15, and, the display may be designed to function as the vibration plate 9 either in its entirety or in part.

The casing 70 comprises the box-shaped casing main body 70a opened at its one surface, and the cover 70b which blocks the opening of the casing main body 70a. The casing 70 (the casing main body 70a and the cover 70b) can be formed preferably using a material having great rigidity and high elasticity, such as synthetic resin.

The cover 70b which serves also as the vibration plate 9 is attached, at its outer periphery, to the casing main body 70a via a casing joining material 16 so as to be able to vibrate. The casing joining material 16 is formed of a material which is softer and becomes deformed more easily than the cover 70b, and is thus smaller than the cover 70b in coefficient of elasticity and rigidity such as Young's modulus, modulus of rigidity, and modulus of volume elasticity. That is, the casing joining material 16 is deformable, and, given that the casing joining material 16 and the cover 70b are subjected to the same force, then the casing joining material 16 becomes deformed more greatly than the cover 70b.

The casing joining material 16 may take either a unitary form or a composite form composed of several members. For example, a double-faced tape formed by applying a sticking agent to both sides of a base material composed of a nonwoven fabric or the like can be preferably used as such a casing joining material 16. The casing joining material 16 is designed so as not to have too large a thickness that would cause attenuation of vibration, and its thickness is thus set to fall in the range of 0.1 mm to 0.6 mm, for example. Note that, when the electronic apparatus is a portable terminal, the material constituting the casing joining material 16 is not limited to a particular material, wherefore the casing joining material 16 may be formed of a material which is harder and less deformable than the cover 70b which serves also as the vibration plate 9. Moreover, under certain circumstances, the casing joining material 16 may be omitted from the construction.

The electronic apparatus 50 incorporates the acoustic generator 1, 110 in which, in frequency-sound pressure characteristics, rapid changes in sound pressure at specific frequencies are suppressed, and is thus capable of transmitting high-quality sound information with evenness in sound pressure characteristics.

Although the above description deals with the electronic apparatus 50 in the form of a portable terminal which has communications means for effecting, for example, transmission and reception of data via an antenna, regardless of the type of the electronic apparatus 50, the electronic apparatus 50 may be applied to various household electronic appliances having sound-producing capability. For example, the electronic apparatus 50 may be applied to various products having sound-producing capability, including cleaners, washing machines, refrigerators, and microwave ovens, let alone flat-screen television sets and an automotive audio apparatus.

EXAMPLES

The following describes a specific example of the acoustic generator according to the invention.

There was prepared a bimorph piezoelectric element in the form of an elongated plate which is 23.5 mm in length, 3.3 mm in width, and 0.9 mm in thickness. Moreover, the piezoelectric element was constructed by laminating 30 μm-thick piezoelectric layers and internal electrodes alternately, and, the total number of the piezoelectric layers was 28. The piezoelectric layer was formed of lead zirconate titanate in which Nb, for example, was substituted in part for Zr. A silver-palladium alloy was used for the internal electrode.

To begin with, ceramic green sheets with printed silver palladium-made conductive pastes were laminated on top of each other, and the laminate was pressurized so that the layers adhere tightly to each other, and cut into a molded body having a predetermined dimension. After that, the molded body was arranged on a firing setter whose lead content was adjusted by application of the calcined powder used in the aforestated production of the piezoelectric layers and calcining process at a temperature of 1100° C., was subjected to degreasing treatment at a predetermined temperature, and was fired at temperature of 1000° C. Thus, a stacked sintered compact was obtained.

The surface electrode and the side electrode were formed by printing a silver-made conductive paste onto the surfaces and sides of the stacked sintered compact, and thereafter drying the paste, and performing firing at a temperature of 700° C. Next, a voltage with a potential difference of 2 kV/mm was applied among the individual internal electrodes through the surface electrode at room temperature to initiate polarization. Thus, the bimorph piezoelectric element was produced.

The capacitance of the region in the side of the first main face (the region away from the firing setter in the firing process) and the capacitance of the region in the side of the second main face (the region close to the firing setter in the firing process) in the piezoelectric element were measured at a frequency of 1 kHz by an impedance/gain-phase analyzer. It is confirmed that in the piezoelectric element, the capacitance of the region in the side of the first main face was 830 nF, and the capacitance of the region in the side of the second main face was 730 nF, that is; the capacitance of the region in the side of the second main face is about 12% lower than the capacitance of the region in the side of the first main face. Since these regions are equal in the thickness of the piezoelectric layer and in the area of the internal electrode, it is confirmed that the relative permittivity of the piezoelectric layers constituting the region in the side of the second main face is lower than the relative permittivity of the piezoelectric layers constituting the region in the side of the first main face.

Moreover, after dividing the piezoelectric element into the region in the side of the first main face (the region away from the firing setter in the firing process) and the region in the side of the second main face (the region close to the firing setter in the firing process) by cutting, the density of each region was measured in conformity with the Archimedes' method. It is confirmed that the density of the region in the side of the first main face was 7.88 g/cm$^3$, and the density of the region in the side of the second main face was 7.79 g/cm$^3$ in the piezoelectric element, that is; the density of the region in the side of the second main face is about 1.1% lower than the density of the region in the side of the first main face.

Next, the acoustic generator was constructed by bonding the piezoelectric element to one lengthwise end of an acrylic plate (vibration plate) which is 110 mm in length, 60 mm in width, and 0.5 mm in thickness with an anaerobic acrylic adhesive paste, and whereafter soldering an insulator-coated lead wire to the surface electrode.

Figure 9:
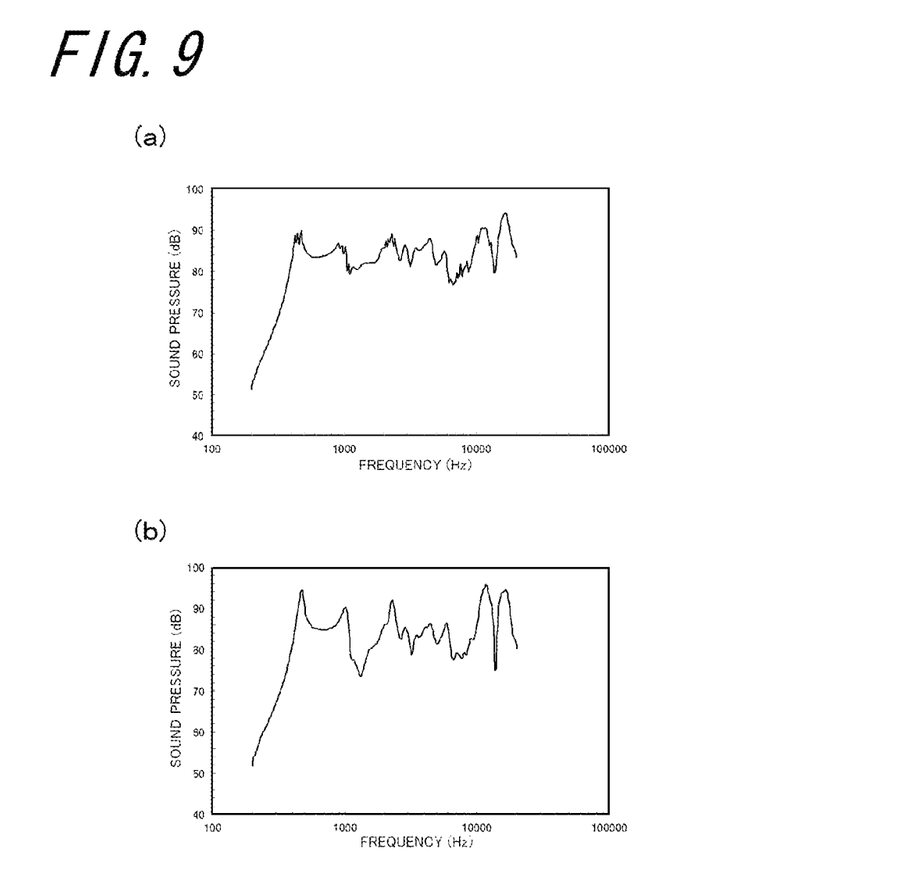
FIG. 9(a) is a graph indicating an example of the frequency-sound pressure characteristics of the acoustic generator in accordance with the embodiment of the invention.
FIG. 9(b) is a graph indicating the frequency-sound pressure characteristics of a conventional acoustic generator.

The outer periphery of each main face of the vibration plate of the acoustic generator thereby constructed as an embodiment of the invention was firmly held by a polybutylene terephthalate-made frame jig for sound-pressure measurement, and, frequency-sound pressure characteristics measurement was conducted in conditions of applied voltage of 30 Vp-p and measurement distance of 3 cm. The result of the measurement is shown in FIG. 9(a).

Meanwhile, there was prepared another acoustic generator constructed as a comparative example in the following manner.

To begin with, a stack of 15 ceramic green sheets that are each free of a printed conductive paste was fired at a temperature of 1050° C. to form a sintered compact, and the sintered compact was placed on a firing setter, and, the aforestated green sheet laminate was arranged on this sintered compact and fired. Otherwise, the method of producing the piezoelectric element of the comparative example is identical to that adopted in the foregoing example. In the thereby constructed piezoelectric element, the capacitance of the region in the side of the first main face (the region away from the firing setter in the firing process) and the capacitance of the region in the side of the second main face (the region close to the firing setter in the firing process) were measured at a frequency of 1 kHz by an impedance/gain-phase analyzer. It is confirmed that in the piezoelectric element, the capacitance of the region in the side of the first main face was 830 nF, and the capacitance of the region in the side of the second main face was 828 nF; that is, the capacitance of the region in the side of the second main face is substantially equal to the capacitance of the region in the side of the first main face. That is, it is confirmed that the relative permittivity of the piezoelectric layers constituting the region in the side of the second main face is equal to the relative permittivity of the piezoelectric layers constituting the region in the side of the first main face.

Moreover, after dividing the piezoelectric element into the region in the side of the first main face (the region away from the firing setter in the firing process) and the region in the side of the second main face (the region close to the firing setter in the firing process) by cutting, the density of each region was measured in conformity with the Archimedes' method. It is confirmed that the density of the region in the side of the first main face was 7.88 g/cm$^3$, and the density of the region in the side of the second main face was 7.88 g/cm$^3$ in the piezoelectric element, that is; the density of the region in the side of the second main face is equal to the density of the region in the side of the first main face.

With use of this piezoelectric element, an acoustic generator was constructed by the same method as adopted in the example. As is the case with the example, the outer periphery of each main face of the vibration plate of this acoustic generator was firmly held by a polybutylene terephthalate-made frame jig for sound-pressure measurement, and, frequency-sound pressure characteristics measurement was conducted in conditions of applied voltage of 30 Vp-p and measurement distance of 3 cm. The result of the measurement is shown in FIG. 9(b).

It is understood that a comparison of FIG. 9(a) and FIG. 9(b) indicates that, especially at frequencies ranging from 400 Hz to 2 kHz, as well as at frequencies ranging from 10 kHz to 20 kHz, peaks and dips in sound pressure as shown in FIG. 9(a) observed in the example are apparently smaller than those as shown in FIG. 9(b) observed in the comparative example.

It can have been confirmed that, in the bimorph piezoelectric element, with the difference in relative permittivity or density between the region in the side of the first main face and the region in the side of the second main face, rapid changes in sound pressure at specific frequencies can be suppressed, thus attaining evenness in sound pressure characteristics for improvement in acoustic quality.

REFERENCE SIGNS LIST 1, 110: Acoustic generator
2: Internal electrode
2a: First internal electrode
2b: Second internal electrode
2c: Third internal electrode
3: Piezoelectric layer
4: Stacked body
5: Surface electrode
5a: First surface electrode
5b: Second surface electrode
5c: Third surface electrode
6: Side electrode
6a: First side electrode
6b: Second side electrode
6c: Third side electrode
7: Piezoelectric element
7a: Region in side of first main face
7b: Region in side of second main face
8: Joining material
9: Vibration plate
10: Acoustic generation device
11: Frame body
12: Joining material
70: Casing
70a: Casing main body
70b: Cover
14: Display
15: Device joining material
16: Casing joining material
50: Electronic apparatus
60: Electronic circuit

The invention claimed is:

1. An acoustic generator, comprising:
a bimorph piezoelectric element composed of a stack of a plurality of internal electrodes and a plurality of piezoelectric layers, the bimorph piezoelectric element having a first main face and a second main face opposite the first main face; and
a vibration plate joined to the second main face of the bimorph piezoelectric element,
the bimorph piezoelectric element including a region in a side of a first main face and a region in a side of a second main face, the plurality of piezoelectric layers constituting the region in the side of the first main face and the plurality of piezoelectric layers constituting the region in the side of the second main face being different from each other in at least one of relative permittivity and density.

2. The acoustic generator according to claim 1,
wherein a relative permittivity of the plurality of piezoelectric layers constituting the region in the side of the second main face is lower than a relative permittivity of the plurality of piezoelectric layers constituting the region in the side of the first main face.

3. The acoustic generator according to claim 2,
wherein the plurality of piezoelectric layers constituting the region in the side of the second main face are arranged in decreasing order of relative permittivity in a direction from the second main face toward the first main face.

4. The acoustic generator according to claim 1,
wherein a density of the plurality of piezoelectric layers constituting the region in the side of the second main face is lower than a density of the plurality of piezoelectric layers constituting the region in the side of the first main face.

5. The acoustic generator according to claim 4,
wherein the plurality of piezoelectric layers constituting the region in the side of the second main face are arranged in decreasing order of density in a direction from the second main face toward the first main face.

6. The acoustic generator according to claim 1, further comprising:
a frame body disposed along an outer periphery of the vibration plate.

7. An acoustic generation device, comprising:
an acoustic generator according to claim 1; and
a housing which accommodates the acoustic generator.

8. An electronic apparatus, comprising:
an acoustic generator according to claim 1;
an electronic circuit connected to the acoustic generator; and
a casing which accommodates the electronic circuit and the acoustic generator,
the electronic apparatus having a function of causing the acoustic generator to produce sound.

* * * * *